United States Patent
Murata et al.

(12)

(10) Patent No.: US 9,054,683 B2
(45) Date of Patent: Jun. 9, 2015

(54) BOOSTING CIRCUIT

(71) Applicant: Seiko Instruments Inc., Chiba (JP)

(72) Inventors: Masaya Murata, Chiba (JP); Tomohiro Oka, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 46 days.

(21) Appl. No.: 13/779,220

(22) Filed: Feb. 27, 2013

(65) Prior Publication Data
US 2013/0234768 A1    Sep. 12, 2013

(30) Foreign Application Priority Data

Mar. 9, 2012    (JP) .................................. 2012-053556

(51) Int. Cl.
| | |
|---|---|
| H03K 5/12 | (2006.01) |
| G11C 5/14 | (2006.01) |
| G11C 8/08 | (2006.01) |
| G11C 16/30 | (2006.01) |
| H02M 3/07 | (2006.01) |
| H02M 1/36 | (2007.01) |

(52) U.S. Cl.
CPC ......... *H03K 5/12* (2013.01); *G11C 5/145* (2013.01); *G11C 8/08* (2013.01); *G11C 16/30* (2013.01); *H02M 3/07* (2013.01); *H02M 1/36* (2013.01)

(58) Field of Classification Search
CPC .......... G11C 5/145; G11C 16/30; G11C 8/08; G11C 11/4074
USPC ......... 327/536, 538, 540, 541, 543, 309, 310, 327/327, 328, 170; 365/226
See application file for complete search history.

(56) References Cited

U.S. PATENT DOCUMENTS

| | | | | |
|---|---|---|---|---|
| 5,280,198 | A * | 1/1994 | Almulla ......................... | 327/535 |
| 7,663,960 | B2 * | 2/2010 | Suzuki et al. ................. | 365/226 |
| 7,755,417 | B2 * | 7/2010 | Suzuki ........................... | 327/536 |

FOREIGN PATENT DOCUMENTS

JP          2005-117773 A       4/2005

* cited by examiner

*Primary Examiner* — Jung Kim
(74) *Attorney, Agent, or Firm* — Brinks Gilson & Lione

(57) ABSTRACT

A boosting circuit is provided which performs an appropriate boosting operation in accordance with load capacitance. In the boosting circuit, a slope control circuit is provided between a limiter circuit, which limits a high voltage obtained by a charge pump circuit to a desired boosted voltage VPP, and a discharge circuit, which makes the boosted voltage VPP drop quickly to a power supply voltage VCC after the completion of writing, to enable a boosting operation in an appropriate boosted-voltage reach time, by increasing the time taken to reach the boosted voltage VPP in the case where the load capacitance is low, while keeping the time taken to reach the boosted voltage VPP unchanged, irrespective of the presence/absence of the slope control circuit, in the case where the load capacitance is high as in the case of selecting the memory cells collectively.

6 Claims, 6 Drawing Sheets

BOOSTING CIRCUIT

RELATED APPLICATIONS

This application claims priority under 35 U.S.C. §119 to Japanese Patent Application No. 2012-053556 filed on Mar. 9, 2012, the entire content of which is hereby incorporated by reference.

BACKGROUND OF THE INVENTION

1. Field of the Invention

The present invention relates to a boosting circuit that performs an appropriate boosting operation in accordance with load capacitance.

2. Description of the Related Art

In a non-volatile memory such as an EEPROM to and from which data can be electrically written, read, and erased, it is necessary to apply a high voltage that is greater than a power supply voltage VCC to a selected memory cell at the time of writing or erasing data. A charge pump circuit which boosts an input voltage has been used to generate a desired high voltage.

Generally, for an EEPROM, an erasing or writing operation may be performed by selecting memory cells on a byte-by-byte basis, or by selecting memory cells collectively. When the load capacitance varies depending on the number of memory cells selected, the time taken for a power supply voltage VCC to reach a desired boosted voltage VPP (hereinafter, referred to as "boosted-voltage reach time tVVP") also varies. In the case of selecting the memory cells on a byte-by-byte basis, the load capacitance is low, resulting in a shorter boosted-voltage reach time tVPP. In contrast, in the case of selecting the memory cells collectively, the load capacitance is high, resulting in a longer boosted-voltage reach time tVPP. If the boosted-voltage reach time tVPP is too short, a high voltage will be applied to the memory cells abruptly, which may accelerate the degradation of the memory cells. In contrast, if the boosted-voltage reach time tVPP is too long, it will not be possible to apply a high voltage to the memory cells for a sufficient period of time, which may lead to incomplete data writing.

In order to solve the above-described problems, the following technique has been proposed (for example, see Patent Document 1). In the boosting circuit disclosed in Patent Document 1, the boosted-voltage reach time tVPP is monitored on a real-time basis, and when the boosted-voltage reach time tVPP is short as compared with the time recorded in advance on a ROM, the clock amplitude is decreased to reduce the boosting capability of a charge pump circuit, to thereby adjust the boosted-voltage reach time tVPP so as not to be short. In this manner, the boosted-voltage reach time tVPP is prevented from becoming too short when the load capacitance is low, thereby realizing a boosting operation in an appropriate boosted-voltage reach time tVPP in accordance with the load capacitance.

[Patent Document 1] Japanese Patent Application Laid-Open No. 2005-117773

SUMMARY OF THE INVENTION

With the boosting circuit in Patent Document 1, however, the ROM and comparator required for comparing the boosted-voltage reach time tVPP with the reference time increase the circuit scale, leading to an increased chip area for the entire EEPROM.

The present invention has been accomplished in view of the foregoing problems, and an object of the present invention is to provide a boosting circuit which can implement a boosting operation in an appropriate boosted-voltage reach time tVPP in accordance with the load capacitance, while suppressing the increase in chip area as far as possible.

A boosting circuit according to the present invention has a charge pump circuit, a limiter circuit for limiting a high voltage obtained by the charge pump circuit to a desired boosted voltage VPP, and a discharge circuit for making the boosted voltage VPP drop to a power supply voltage VCC, the boosting circuit further including a slope control circuit disposed between the limiter circuit and the discharge circuit, the slope control circuit being operable to increase the time taken to reach the boosted voltage VPP in the case where load capacitance is low, and to reduce the time taken to reach the boosted voltage VPP in the case where the load capacitance is high.

According to the boosting circuit of the present invention, the slope control circuit having a simple circuit configuration makes it possible to implement a boosting operation in an appropriate boosted-voltage reach time tVPP in accordance with the load capacitance, while suppressing the increase in chip area as far as possible.

DETAILED DESCRIPTION OF THE PREFERRED EMBODIMENTS

An embodiment of the present invention will be described below with reference to the drawings.

Figure 1:
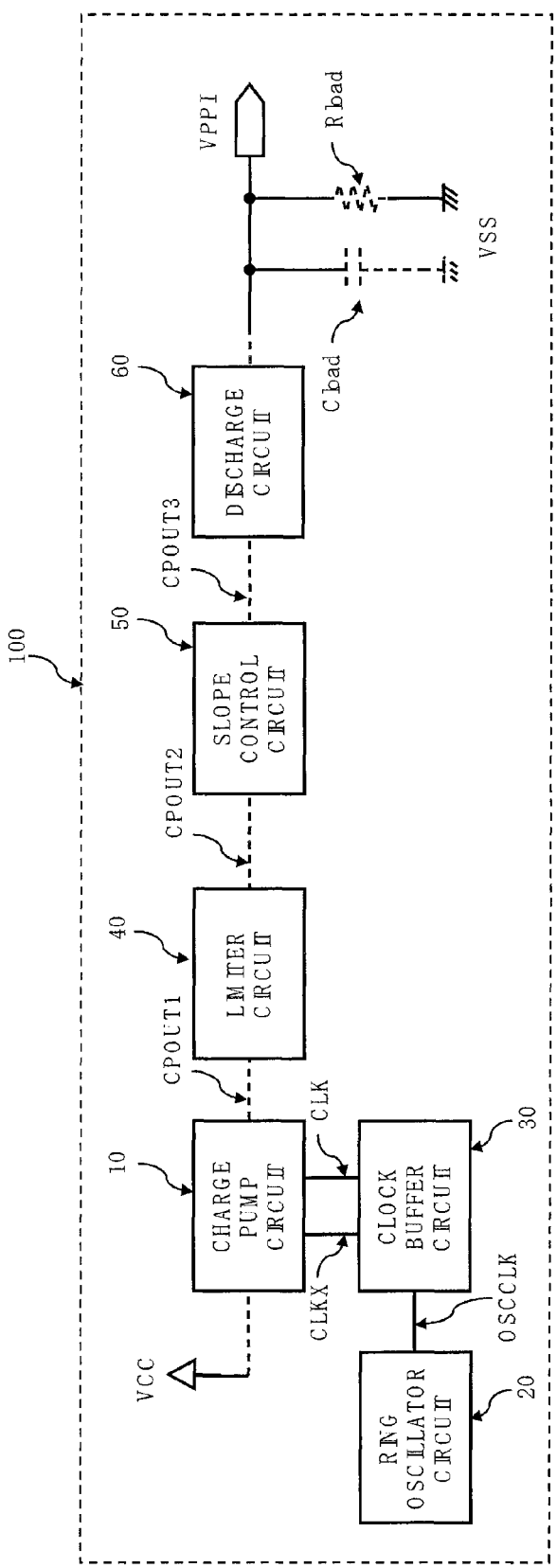
FIG. 1 is a schematic diagram showing a boosting circuit according to an embodiment of the present invention.

FIG. 1 is a schematic diagram showing a boosting circuit according to the present embodiment.

A boosting circuit 100 of the present embodiment shown in FIG. 1 includes: a charge pump circuit 10 that boosts a power supply voltage VCC to a high voltage VPP necessary for writing; a ring oscillator circuit 20 and a clock buffer circuit 30 that generate a clock to be input to the charge pump circuit 10; a limiter circuit 40 that limits the high voltage obtained by the charge pump circuit 10 to a desired boosted voltage VPP; a discharge circuit 60 that makes the boosted voltage VPP drop quickly to the power supply voltage VCC at the completion of writing; and a slope control circuit 50, provided between the limiter circuit 40 and the discharge circuit 60, for controlling the time (the boosted-voltage reach time tVPP) taken for the power supply voltage VCC to reach the desired boosted voltage VPP in accordance with load capacitance Cload.

Figure 2:
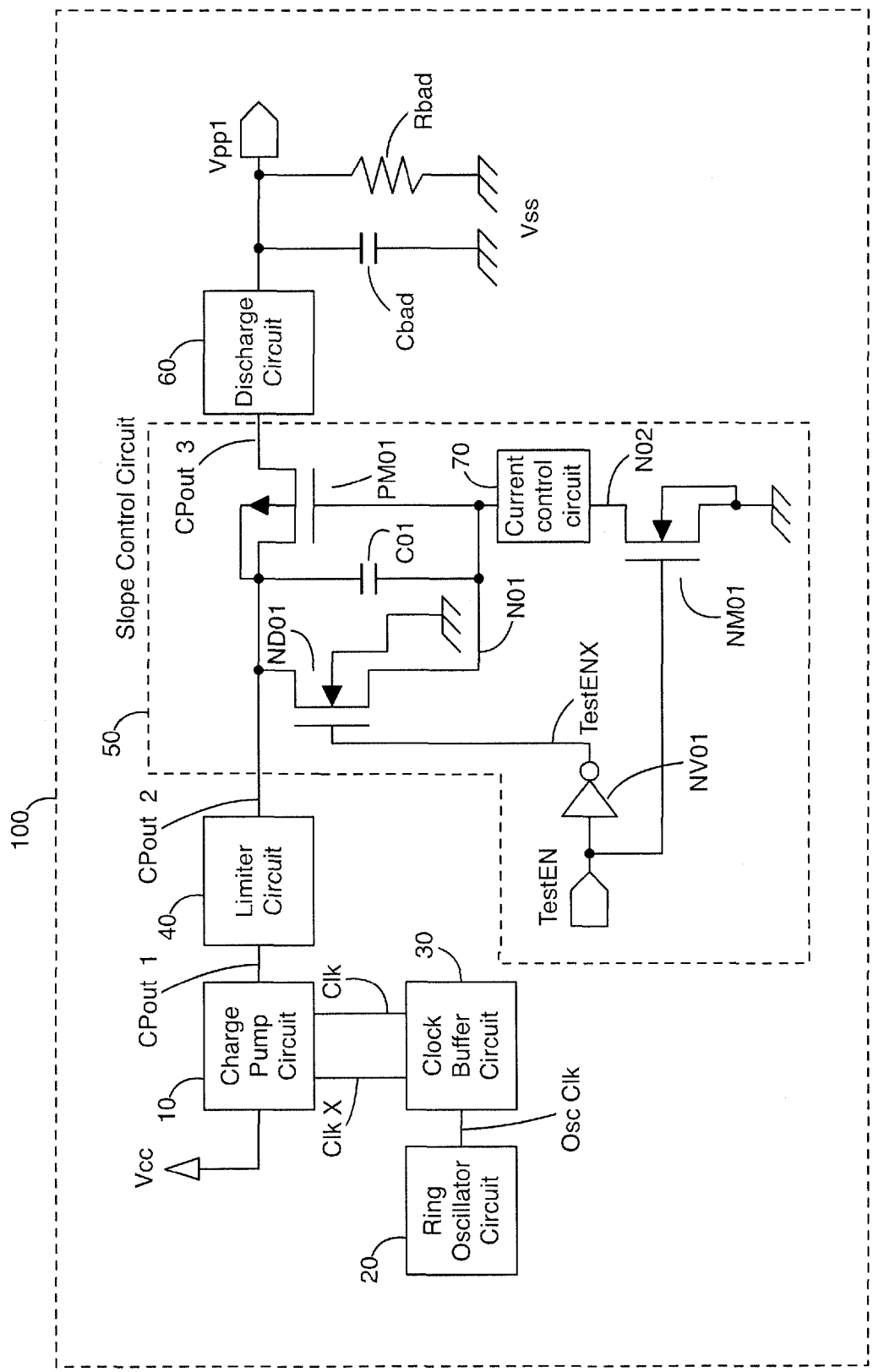
FIG. 2 is a circuit diagram showing a slope control circuit in the boosting circuit of the present embodiment.

FIG. 2 is a circuit diagram showing the slope control circuit in the boosting circuit of the present embodiment.

The slope control circuit 50 shown in FIG. 2 is made up of an input terminal of a test signal TESTEN, an inverter INV01, a PMOS transistor PM01, a capacitor C01, a depletion-mode NMOS transistor ND01, a current control circuit 70, and an NMOS transistor NM01.

The PMOS transistor PM01 has a source and substrate connected to an output CPOUT2 of the limiter circuit 40, a drain connected to an input CPOUT3 of the discharge circuit 60, and a gate connected to a node N01. The capacitor C01 and the depletion-mode NMOS transistor ND01 are connected in parallel between the gate and the source of the PMOS transistor PM01. The depletion-mode NMOS transistor ND01 has a drain connected to the source of the PMOS transistor PM01, a source connected to the gate of the PMOS transistor PM01, a substrate potential connected to a ground potential VSS, and a gate connected to the test signal input terminal TESTEN via the inverter INV01. Further, the node N01 at the gate of the PMOS transistor is connected to the current control circuit 70, and a node N02 at the other end of the current control circuit 70 is connected to the NMOS transistor NM01. The NMOS transistor NM01 has a drain connected to the node N02 of the current control circuit 70, a source and substrate potential connected to the ground potential VSS, and a gate connected to the test signal input terminal TESTEN.

An overview of the operations of the slope control circuit 50 will be provided below about the case where the load capacitance Cload is low and the case where the load capacitance Cload is high as in the case of selecting the memory cells collectively.

Figure 3:
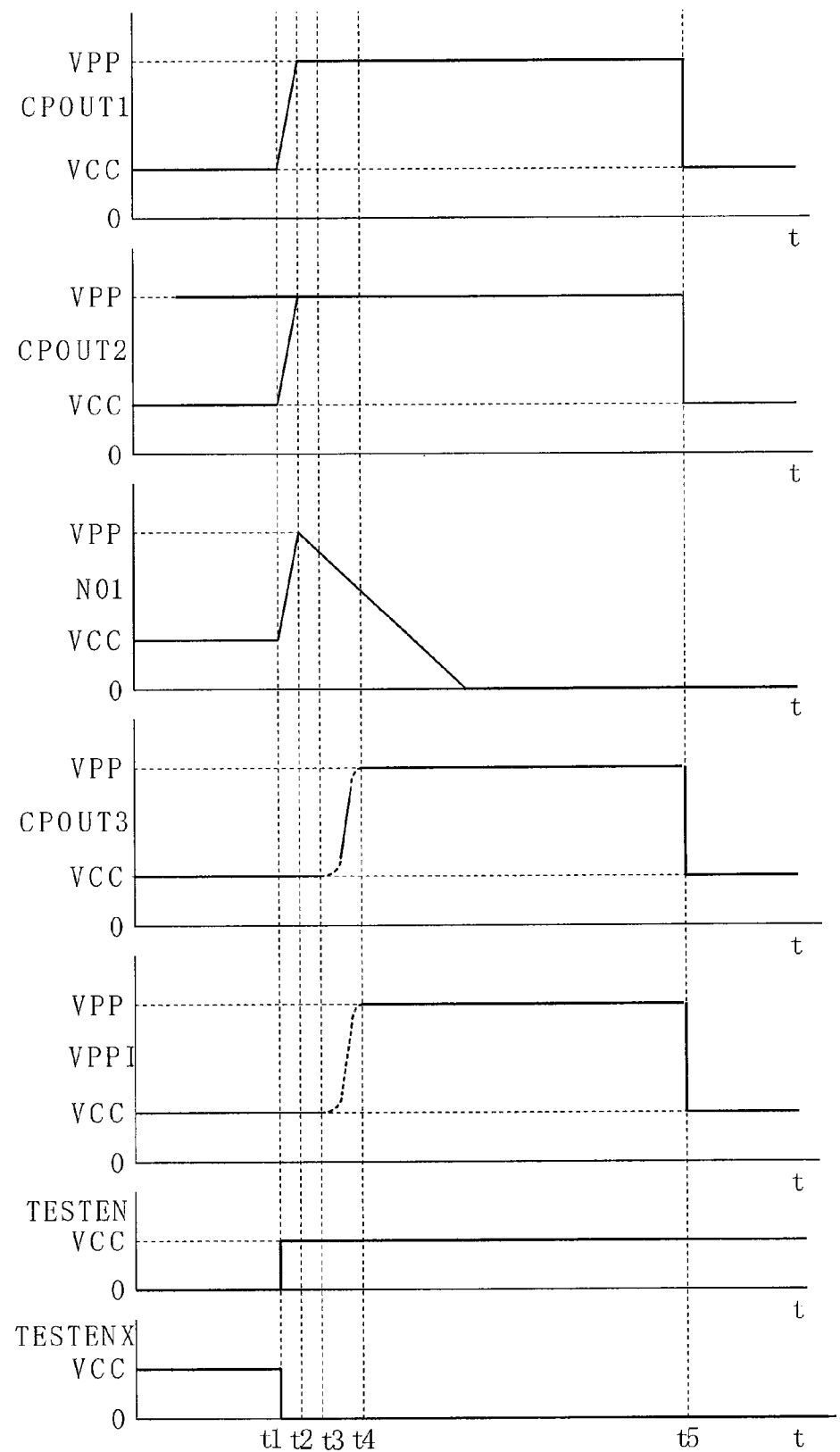
FIG. 3 is a status transition diagram of the nodes in the case where the load capacitance is low in the boosting circuit of the present embodiment.

FIG. 3 is a status transition diagram of the nodes in the case where the load capacitance is low in the boosting circuit of the present embodiment. The time up to time t1 corresponds to the period before writing, the time from time t1 to time t5 corresponds to the period during writing, and the time after time t5 corresponds to the period after the completion of writing.

Before writing (time 0 to time t1), the test signal input terminal TESTEN is input a ground potential VSS, and the inverted test signal TESTENX becomes a power supply voltage VCC, so that the depletion-mode NMOS transistor ND01 is ON, while the NMOS transistor NM01 is OFF. Further, the output potential CPOUT1 of the charge pump circuit 10, the output potential CPOUT2 of the limiter circuit 40, the output potential CPOUT3 of the slope control circuit 50, and the output potential VPPI of the boosting circuit are the power supply voltage VCC. As the depletion-mode NMOS transistor ND01 is ON, the N01 potential is the power supply voltage VCC, as is the output potential CPOUT2 of the limiter circuit 40. That is, before writing, the gate-source potential difference of the PMOS transistor PM01 and the potential difference of the capacitor C01 are 0 V, and the PMOS transistor PM01 is OFF.

At the start of writing (time t1 to time t2), the test signal input terminal TESTEN is input a power supply voltage VCC, and the inverted test signal TESTENX becomes a ground potential VSS, and therefore, the depletion-mode NMOS transistor ND01 is OFF, while the NMOS transistor NM01 is ON. The charge pump circuit 10 boosts the output potential CPOUT1 of the charge pump circuit 10 and the output potential CPOUT2 of the limiter circuit 40 from the power supply voltage VCC to a boosted voltage VPP. At this time, with the coupling operation of the capacitor C01, the N01 potential is boosted from the power supply voltage VCC to the boosted voltage VPP, following the output potential CPOUT2 of the limiter circuit 40. Accordingly, at the start of writing, the gate-source voltage Vgs of the PMOS transistor PM01 is 0 V, and the PMOS transistor PM01 does not turn on, leaving the output potential CPOUT3 of the slope control circuit 50 unchanged at the power supply voltage VCC. That is, at the start of writing, the output potential VPPI of the boosting circuit remains the power supply voltage VCC.

When the output potential COUPT2 of the limiter circuit 40 has been boosted to the boosted voltage VPP, the coupling operation of the capacitor C01 is finished (time t2). As the NMOS transistor NM01 is ON at this time, the N01 potential is gradually decreased from the boosted voltage VPP to the ground potential VSS by the current control circuit 70. Accordingly, the gate-source voltage Vgs of the PMOS transistor PM01 gradually increases negatively from 0 V. The PMOS transistor PM01 turns on only after the gate-source voltage Vgs of the PMOS transistor PM01 attains a certain value (time t3). After the turning on of the PMOS transistor PM01 (time t3 to time t4), the gate-source voltage Vgs of the PMOS transistor PM01 further increases negatively. This causes the ON resistance of the PMOS transistor PM01 to gradually decrease, so that the output potential CPOUT3 of the slope control circuit 50 is boosted slowly from the power supply voltage VCC to the boosted voltage VPP. That is, the output potential VPPI of the boosting circuit at the time of writing is also boosted gradually from the power supply voltage VCC to the boosted voltage VPP. Accordingly, in the case where the load capacitance Cload is low, by virtue of the slope control circuit 50, the boosted-voltage reach time tVPP is elongated to the time from t1 to t4 (t4-t1), while it was the time from t1 to t2 (t2-t1) in a conventional circuit configuration. This enables the boosting operation in an appropriate boosted-voltage reach time tVPP, without abruptly applying a high voltage to the memory cells and, hence, without accelerating the degradation of the memory cells.

Lastly, following the completion of writing (time t5 and on), the test signal input terminal TESTEN is input a power supply voltage VCC, and the inverted test signal TESTENX becomes a ground potential VSS, as in the period during writing. Therefore, the depletion-mode NMOS transistor ND01 is OFF, while the NMOS transistor NM01 is ON, leaving the N01 potential unchanged at the ground potential VSS. Then, the discharge circuit 60 makes the output potential CPOUT1 of the charge pump circuit 10, the output potential CPOUT2 of the limiter circuit 40, the output potential CPOUT3 of the slope control circuit 50, and the output potential VPPI of the boosting circuit drop quickly from the boosted voltage VPP to the power supply voltage VCC.

A description will now be made about the case where the load capacitance Cload is high, as in the case of selecting the memory cells collectively.

Figure 4:
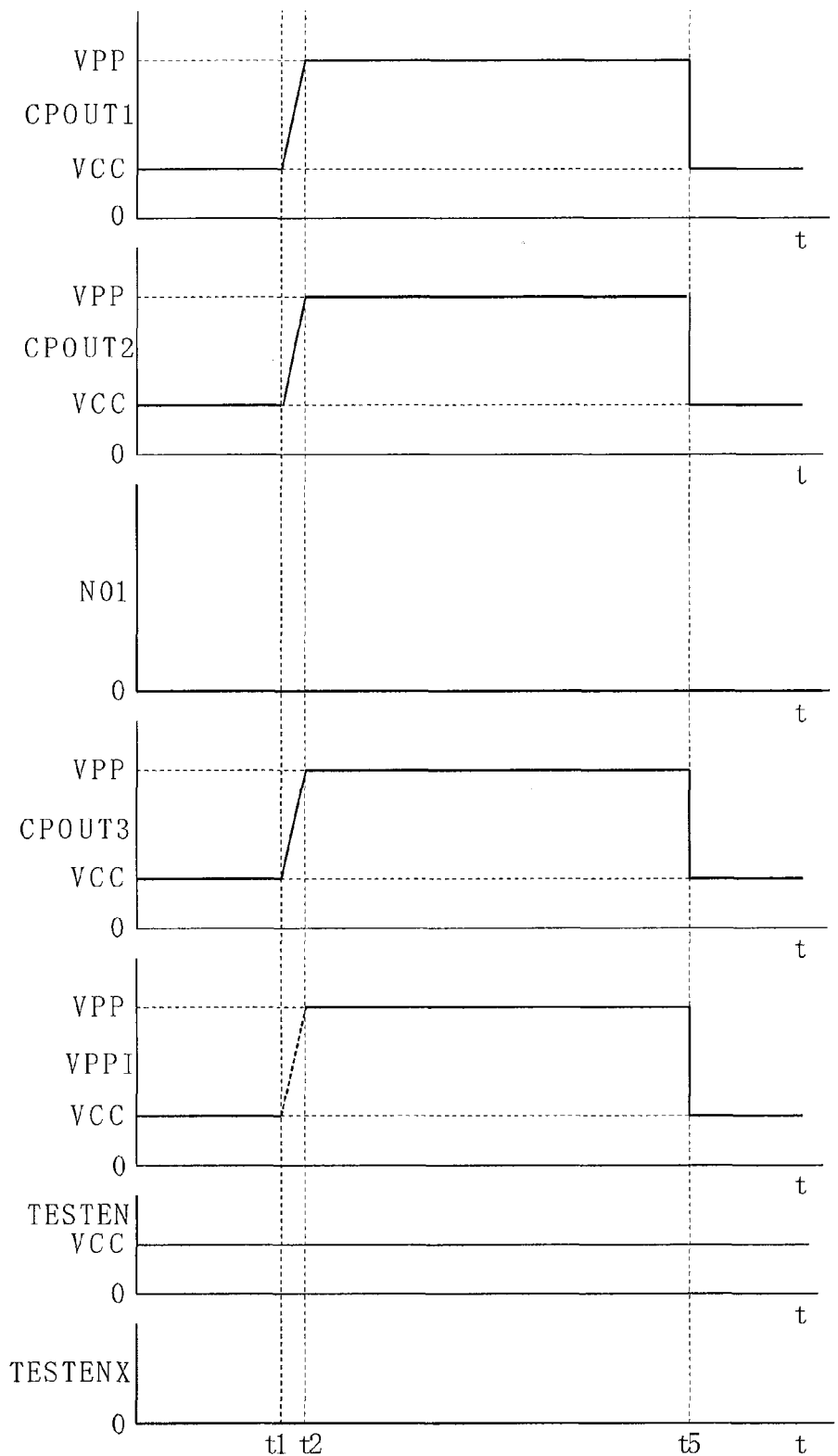
FIG. 4 is a status transition diagram of the nodes in the case where the load capacitance is high in the boosting circuit of the present embodiment.

FIG. 4 is a status transition diagram of the nodes in the case where the load capacitance is high in the boosting circuit of the present embodiment.

When the load capacitance Cload is high, the test signal input terminal TESTEN is input a power supply voltage VCC, and the inverted test signal TESTENX becomes a ground potential VSS through all the states before writing, during writing, and at and after the completion of writing. Therefore, the depletion-mode NMOS transistor ND01 is OFF, while the NMOS transistor NM01 is ON. Accordingly, through all the states, the N01 potential is 0 V and, hence, the PMOS transistor PM01 is ON. That is, in the case where the load capacitance Cload is high as in the case of selecting the memory cells collectively, the boosted-voltage reach time tVPP would hardly change, irrespective of the presence/absence of the slope control circuit 50. Therefore, by designing the elements in optimal size, it is possible to apply a high voltage to the memory cells for a sufficient period of time, completely write data, and do the boosting operation in an appropriate boosted-voltage reach time tVPP.

Another example of the slope control circuit in the boosting circuit of the present embodiment will now be described.

Figure 5:
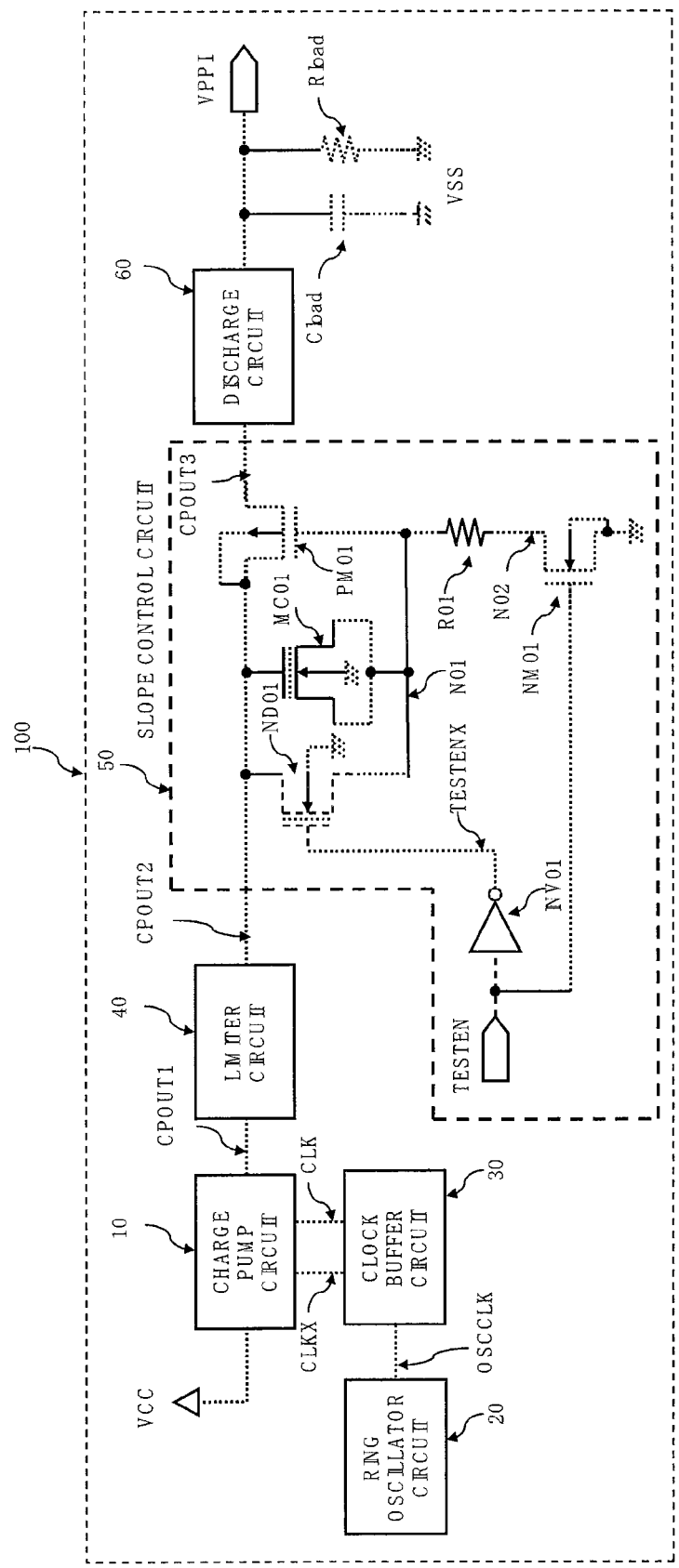
FIG. 5 is a circuit diagram showing another example of the slope control circuit in the boosting circuit of the present embodiment.

In FIG. 5, the capacitor C01 in the example shown in FIG. 2 has been replaced with a depletion-mode NMOS transistor MC01. The depletion-mode NMOS transistor MC01 has a gate connected to the source of the PMOS transistor PM01, a source and drain connected to the gate of the PMOS transistor PM01, and a substrate potential connected to the ground potential VSS. The depletion-mode NMOS transistor MC01 has its source and drain common with each other, so that no current flows therethrough. Further, the depletion-mode NMOS transistor MC01 has a region beneath the gate doped with a high concentration of impurity, so that a channel exists beneath the gate even when the gate-source voltage Vgs is 0 V. Therefore, the depletion-mode NMOS transistor MC01 can be used as an oxide film capacitor between the gate and channel, with its capacitance value determined according to the area of the gate. Further, the current control circuit 70 that was shown in FIG. 2 is configured by a resistor R01.

Figure 6:
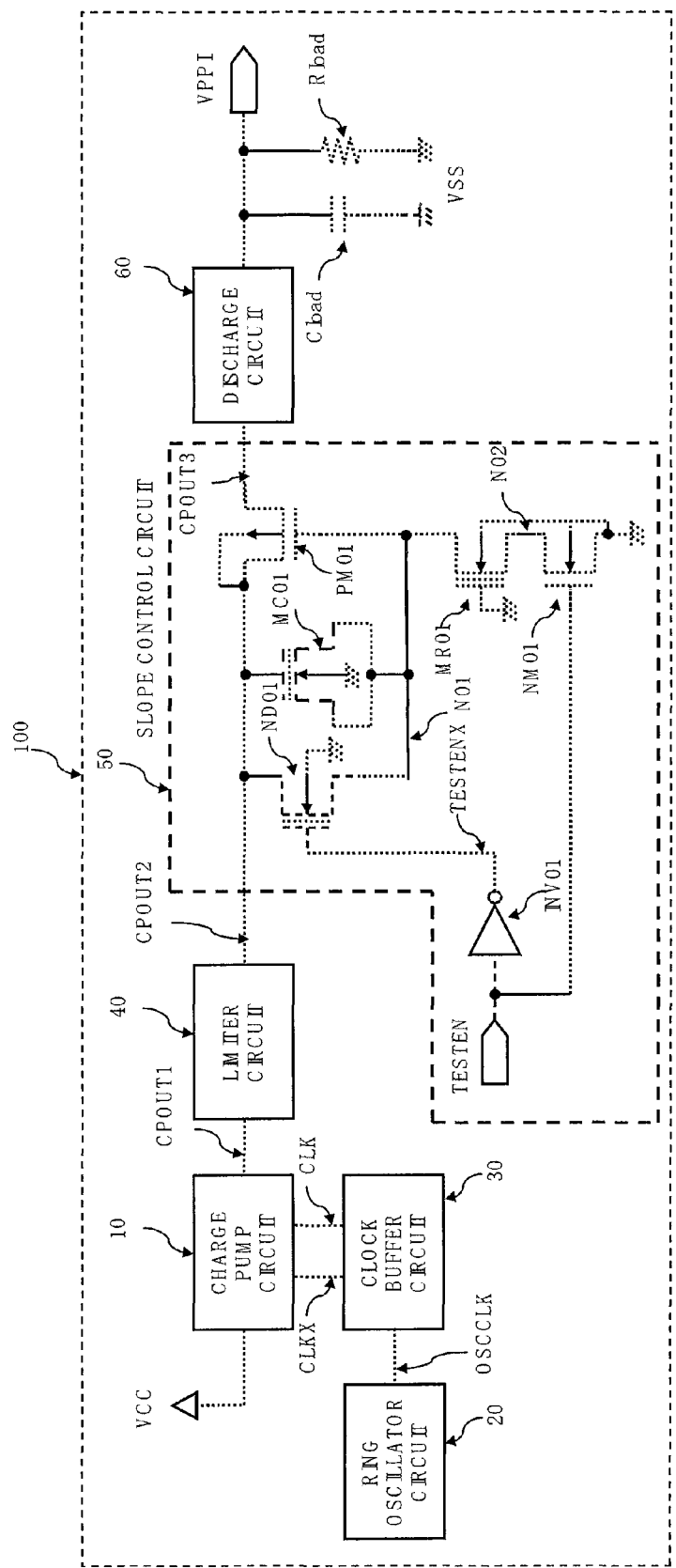
FIG. 6 is a circuit diagram showing yet another example of the slope control circuit in the boosting circuit of the present embodiment.

FIG. 6 shows yet another configuration where the resistor R01 in the example shown in FIG. 5 has been replaced with a depletion-mode NMOS transistor MR01. The depletion-mode NMOS transistor MR01 has a drain connected to the gate of the PMOS transistor PM01, a source connected to the drain of the NMOS transistor NM01, and a gate and substrate potential connected to the ground potential VSS. The depletion-mode NMOS transistor MR01 has a region beneath the gate doped with a high concentration of impurity, so that a channel exists beneath the gate even when the gate-source voltage Vgs is 0 V. Accordingly, a current flows through the depletion-mode NMOS transistor MR01 as long as the drain-source voltage Vds is not smaller than a certain value, even though the gate is connected to the ground potential VSS. As such, the depletion-mode NMOS transistor MR01 can be used as the current control circuit. In the slope control circuit 50, in the case where the load capacitance Cload is low, the boosted-voltage reach time tVPP is elongated by sufficiently conducting the coupling operation of the capacitor at the start of writing, and then, by slowly decreasing the gate potential N01 of the PMOS transistor PM01 to the ground potential VSS by the current control circuit 70, to thereby gradually turn on the PMOS transistor PM01. This configuration requires a large capacitance value of the capacitor C01 in order to cause it to perform the coupling operation sufficiently. It is also necessary to increase the resistance value of the resistor R01 and increase the gate length L of the depletion-mode NMOS transistor MR01 in order to restrict the current to thereby slowly decrease the gate potential N01 of the PMOS transistor PM01 to the ground potential VSS. Accordingly, depending on the processes, the depletion-mode NMOS transistors may be able to reduce the element size and the chip area, compared to the case of using normal capacitive and resistive elements.

As described above, according to the boosting circuit 100 of the present embodiment, by virtue of the slope control circuit 50 provided between the limiter circuit 40 and the discharge circuit 60, the boosted-voltage reach time tVPP is elongated when the load capacitance Cload is low, while the boosted-voltage reach time tVPP would hardly change, irrespective of the presence/absence of the slope control circuit, when the load capacitance Cload is high as in the case of selecting the memory cells collectively. This enables a boosting operation in an appropriate boosted-voltage reach time tVPP.

While the examples of the present invention have been described above, the present invention is not limited to these examples. The present invention can be embodied in various manners within the scope not departing from the gist thereof.

What is claimed is:

1. A boosting circuit comprising:
    a charge pump circuit;
    a limiter circuit for limiting a high voltage obtained by the charge pump circuit to a desired boosted voltage; and
    a discharge circuit for making the boosted voltage drop to a power supply voltage,
    the boosting circuit further comprising a slope control circuit between the limiter circuit and the discharge circuit,
    the slope control circuit including a transistor having a gate coupled to a capacitive element, the capacitive element comprising one of a capacitor or a depletion-mode transistor,
    the transistor of the slope control circuit having a source connected to an output of the limiter circuit and to the capacitive element and a drain connected to an input of the discharge circuit,
    the transistor of the slope control circuit being initially in an OFF state and operable to be in an ON state in response to the boosted voltage applied by the capacitive element to increase the time taken to reach the boosted voltage in the case where a load capacitance is low, and the transistor of the slope control circuit being in an ON state operable to reduce the time taken to reach the boosted voltage in the case where the load capacitance is high.

2. The boosting circuit according to claim 1, wherein the slope control circuit includes a PMOS transistor forming the transistor of the slope control circuit, a depletion-mode NMOS transistor, the capacitive element comprising a capacitor, a current control circuit, an NMOS transistor, an inverter circuit, and a test signal input terminal,
    wherein the PMOS transistor includes a source connected to the limiter circuit, a drain of the depletion-mode NMOS transistor, and to a first terminal of the capacitor, the PMOS transistor further including a drain connected to the discharge circuit and a gate connected to a source of the depletion-mode NMOS transistor, a second terminal of the capacitor, and to a first terminal of the current control circuit,
    the NMOS transistor includes a source connected to a ground terminal, a drain connected to a second terminal of the current control circuit, and a gate connected to the test signal input terminal, and
    wherein the test signal input terminal is further connected to a gate of the depletion-mode NMOS transistor via the inverter circuit.

3. The boosting circuit according to claim 2, wherein the current control circuit comprises a resistive element.

4. The boosting circuit according to claim 2, wherein the current control circuit comprises a second depletion-mode NMOS transistor,
    the second depletion-mode NMOS transistor including a drain connected to the gate of the PMOS transistor, a source connected to the drain of the NMOS transistor, and a gate connected to the ground terminal.

5. The boosting circuit according to claim 2, wherein the capacitive element comprises the depletion-mode NMOS transistor having a gate comprising the first terminal and a source and drain comprising the second terminal.

6. A boosting circuit comprising:
    a charge pump circuit;

a limiter circuit for limiting a high voltage obtained by the charge pump circuit to a desired boosted voltage; and a discharge circuit for making the boosted voltage drop to a power supply voltage, the boosting circuit further comprising a slope control circuit between the limiter circuit and the discharge circuit, the slope control circuit including a PMOS transistor, a depletion-mode NMOS transistor, a capacitor, a current control circuit, an NMOS transistor, an inverter circuit, and a test signal input terminal, wherein the PMOS transistor includes a source connected to the limiter circuit, a drain of the depletion-mode NMOS transistor, and to a first terminal of the capacitor, the PMOS transistor further including a drain connected to the discharge circuit and a gate connected to a source of the depletion-mode NMOS transistor, a second terminal of the capacitor, and to a first terminal of the current control circuit, the NMOS transistor includes a source connected to a ground terminal, a drain connected to a second terminal of the current control circuit, and a gate connected to the test signal input terminal, and wherein the test signal input terminal is further connected to a gate of the depletion-mode NMOS transistor via the inverter circuit, the slope control circuit operable to increase the time taken to reach the boosted voltage in the case where load capacitance is low, and to reduce the time taken to reach the boosted voltage in the case where the load capacitance is high.

* * * * *